United States Patent [19]
Kitamura

[11] Patent Number: 6,052,222
[45] Date of Patent: Apr. 18, 2000

[54] SEMICONDUCTOR OPTICAL AMPLIFIER

[75] Inventor: Shotaro Kitamura, Tokyo, Japan

[73] Assignee: NEC Corporation, Japan

[21] Appl. No.: 08/993,749

[22] Filed: Dec. 19, 1997

[30] Foreign Application Priority Data

Dec. 26, 1996 [JP] Japan .................................... 8-347835

[51] Int. Cl.[7] .............................. H01L 21/20; G02F 1/25; H01S 3/18
[52] U.S. Cl. ........................... 359/344; 359/337; 372/45; 372/66
[58] Field of Search .................................. 359/337, 344; 257/13, 431; 372/45, 93, 66

[56] References Cited

U.S. PATENT DOCUMENTS 5,088,105   2/1992   Scifres et al. .............................. 372/92

FOREIGN PATENT DOCUMENTS 4159513   6/1992   Japan .
527130    2/1993   Japan .

OTHER PUBLICATIONS

I. Cha, et al., "1•5 μm Band Travelling–Wave Semiconductor Optical Amplifiers with Window Facet Structure", Electronics Letters, Aug. 31, 1989, vol. 25, No. 18, p. 1241.

C.E. Zah, et al., "Fabrication and Performance of 1•5 μm GaInAsP Travelling–Wave Laser Amplifiers with Angled Facets", Electronics Letters, Sep. 10, 1987, vol. 23, No. 19, pp. 9–10.

S. Kitamura, et al., "Very Low Power Consumption Semiconductor Optical Amplifier Array", IEEE Photonics Technol. Letters, Feb. 2, 1995, vol. 7, No. 2, pp. 11–12.

L.F. Tiemeijer, et al., "Progress in 1.3 μm Polarization Insensitive Multiple Quantum Well Laser Amplifiers", OAA '94, Technical Digest 34/WD1–1 (1994), pp. 34–36.

P. Doussiere, et al., "1550 nm Polarization Independent DBR Gain Clamped SOA With High Dynamic Input Power Range", ECOC '96 Proceedings, vol. 3, WeD.2.4, pp. 5–8.

S. Chelles, et al., "Polarization Insensitive Wavelength Conversion by Cross Gain Modulation in a Strained MQW Optical Amplifier", ECOC '96 Proceedings, vol. 4, ThB.2.5, pp. 13–16.

S. Kitamura, et al., "Low–Switching–Current SOA Gate Module with Wide Optical Input Dynamic Range", ECOC '96 Proceedings, vol. 3, WeP.17, pp. 1–2.

G. Soulage, et al., "4X4 Space–Switch Based on Clamped–Gain Semiconductor Optical Amplifiers in a 16x10 Gbit/x WDM Experiment", ECOC '96 Proceedings, vol. 4, ThD.2.1, pp. 17–20.

Walpole, J.N., et al., "Diffraction–Limited 1.3–MUM– Wavelength Tapered–Gain–Region Lasers With. . .", *IEEE Photonics Technology Letters*, vol. 8, No. 11, Nov. 1996, pp. 1429–1431.

Zhu, N.H., et al., "Proposal for High Extinction Ratio LiNbO$_3$ Optical Waveguide Cutoff Modulator", *IEE Proceedings: Optoelectronics*, vol. 142, No. 5, Oct. 1, 1995, pp. 248–250.

*Patent Abstracts of Japan*, vol. 016, No. 327, Jul. 16, 1992//JP 4–097206, Mar. 30, 1992.

"Optischer Verstaerker Mit Neidriger Superlumineszenz", *Neues Aus der Technik*, No. 6, Dec. 1981 p. 2.

Chelles, S., et al., "Polarization Insensitive Wavelength Conversion by Cross Gain Modulation in a Strained MQW Optical Amplifier", *22nd European Conference on Optical Communications*, vol. 4, 1996, pp. 53–56.

Fabrication and Performance of 1–5 μm Gains AsP Travelling–Wave Laser Amplifiers With Angled Facets—*Electronics Letters*, Sep. 10th, 1987, vol. 23, No. 19, pp. 990–992.

*Primary Examiner*—Nelson Moskowitz

[57] ABSTRACT

A semiconductor optical amplifier which has a good extinction ratio and a simple structure includes an optical waveguide having at least a curved portion. The optical waveguide has light input and output ends offset from each other to keep optical fibers out of alignment with each other at respective opposite ends of the optical waveguide.

10 Claims, 5 Drawing Sheets

SEMICONDUCTOR OPTICAL AMPLIFIER

BACKGROUND OF THE INVENTION

1. Field of the Invention

The present invention relates to the art of optical communications, and more particularly a semiconductor optical amplifier for amplifying and extinguishing signal light.

2. Description of the Related Art

Semiconductor optical amplifiers (hereinafter referred to as "SOA") are devices having an optical amplifying medium in the form of a striped optical waveguide, that is, "an active stripe". The SOA amplifies for amplifying signal light without converting it into an electric signal.

SOAs have a structure that is basically the same as semiconductor lasers. However, SOAs have device ends covered with anti-reflecting coatings to reduce their light reflectances, so that SOAs are not of an optical resonator structure.

Therefore, even when a carrier is injected, SOAs suppress laser oscillation, but output amplified light due to stimulated emission in response to input signal light.

SOAs are reported in various documents including:

(1) I. Cha, et. al., Electr. Lett. Vol. 25. pp 1241–1242 (1989);

(2) C. E. Zah, et. al., Electr. Lett. Vol. 23. pp 990–991 (1987);

(3) S. Kitamura, et. al., IEEE Photonics Technol. Lett. Vol. 7, pp 147–148 (1995);

(4) L. F. Tiemeijer, OAA '94, Technical Digest 34/WD1-1 (1994);

(5) P. Doussiere, et. al., ECOC '96, Proceeding Vol. 3, Wed 2.4 (1996); and (6) S. Chelles, et. al., ECOC '96, Proceeding Vol. 4, ThB 2.5 (1996).

The documents (4)–(6) even disclose a modularization of an SOA and optical fibers, and report that the gain between the optical fibers can be of 20 dB or higher, and the saturated output of amplified signal light is of nearly 10 dBm.

SOAs function as carrier-injected optical gates as well as devices for amplifying signal light.

Specifically, the active stripe of an SOA amplifies signal light when it is turned on, i.e., when a current is injected into the active stripe, and exhibits a high light absorption capability when it is turned off, i.e., when no current is injected into the active stripe. Therefore, the optical waveguide with the active stripe serving as a core layer thereof is capable of turning on and off guided light.

Strong demand is predicted for optical matrix switches for signal light cross connect applications in future optical communication networks. SOAs are currently most promising for use as optical gate elements of such optical matrix switches.

The extinction ratio of SOAs at the time they are turned on and off is larger than that of electro-absorption semiconductor modulators or optical directional coupler switches.

Therefore, if optical matrix switches are constructed using SOAs as optical gate elements, then they will be able to realize optical communication networks with very small crosstalk.

Reports on the optical gate function of SOAs are seen in documents:

(7) S. Kitamura, et. al., ECOC '96, Proceeding Vol. 3, WeP 17 (1996); and (8) G. Soulage, et. al., ECOC '96, Proceeding Vol. 4, ThD 2.1 (1996).

These documents report extinction ratios of 50 dB or higher.

However, the SOAs revealed in the documents (4)–(8) are complex in structure and cannot be manufactured efficiently because they are modularized using a lens system.

Efforts have been made in recent years to modularize SOA and optical fibers by directly and optically coupling the SOA to the optical fibers without the use of a lens system.

According to these efforts, signal light injected from one of the optical fibers to the SOA cannot be converged by a lens system. In order to make up for a loss of the signal light which is caused by the lack of a lens system, it has been attempted to form the tip end of the optical fiber into a hemispherical shape, or it has been attempted to provide the SOA with a structure for converting a light spot size.

With optical fibers directly coupled to the opposite ends of an SOA without a lens system, part of signal light emitted from one of the optical fibers is not optically coupled to the optical waveguide of the SOA, but passes around the optical waveguide and directly reaches the other optical fiber.

Such light is referred to as stray light. When an SOA is used as a switching gate, stray light is not optically absorbed by the active stripe when it is turned off, i.e., when no current is injected into the active stripe, and hence the extinction ratio of the SOA is lowered.

The extinction ratio of such simplified SOA modules with optical fibers directly optically coupled thereto is about 30 dB. If an optical matrix switch with many input and output terminals is constructed of such SOAs, then the reduced extinction ratio is responsible for signal crosstalk.

SUMMARY OF THE INVENTION

It is therefore an object of the present invention to provide an SOA which has a good extinction ratio and is simple in structure.

According to the present invention, a semiconductor optical amplifier comprises an optical waveguide formed by an active stripe, and the active stripe has at least a curved portion. When optical fibers are optically coupled to the input and output ends of the optical waveguide without using a lens system, the optical fibers have respective ends kept out of alignment with each other.

Injected light into the optical waveguide from the input optical fiber is guided through the curved optical waveguide, and emitted into the output optical fiber. Stray light that enters from the input optical fiber into a region around the optical waveguide travels substantially straight, and does not enter into the output optical fiber that is aligned with the light output end of the curved optical waveguide.

Therefore, even though the optical fibers are optically coupled to the input and output ends of the optical waveguide without using a lens system, stray light emitted from the input optical fiber does not reach the output optical fiber. The semiconductor optical amplifier thus provides a good extinction ratio when it is used as an optical gate element.

The semiconductor optical amplifier may have various specific structures.

For example, the optical waveguide may be of an S-shape with the light input end and the light output end being offset from each other. Since the optical fibers optically coupled to the opposite ends of the optical waveguide may be positioned parallel to each other and out of alignment with each other, the optical fibers may be arranged in position with ease.

The light input end and the light output end may be offset from each other by a distance of at least 20 μm. If the optical fibers have a diameter of 9 μm as is the case with general optical fibers and the semiconductor optical amplifier has an overall length of slightly less than 1 mm as is the case with general semiconductor optical amplifiers, then stray light emitted from one of the optical fibers can be well prevented from entering the other optical fiber. In this case, the semiconductor optical amplifier may have an extinction ratio of about 40 dB or higher, and perform functions that are required as an optical gate element.

When the light input end and the light output end are offset from each other, they are spaced from each other by the distance between an extension of the central axis of the light input end and the central axis of the end of the light output end, for example.

The semiconductor optical amplifier may have a light shield disposed between an extension of the central axis of the light input end and the light output end, and also another a light shield disposed between an extension of the central axis of the light output end and the light input end. Stray light around an input waveguide end, injected from an optical fiber, diverges and propagates in a medium of a cladding layer and substrate. However, the divergence and propagation is blocked by the light shields and hence does not reach to the opposite waveguide end. Therefore, the stray light does not enter into the output optical fiber that is aligned to the opposite waveguide. The extinction ratio of the semiconductor optical amplifier is made better by the light shields.

Each of the light shields may comprise a groove. If the light shields are in the form of grooves, then they can be formed with ease.

The semiconductor optical amplifier may further comprise a substrate, and the optical waveguide may comprise a layer disposed on the substrate. The light shield may include a portion extending from a surface of the substrate into the substrate and having a depth of at least 4 μm. If the optical fiber core has a diameter of about 9 μm as is the case with general optical fibers, then the bottoms of the light shields are as deep as the bottom of the fiber core outline, so that the light shields are highly effective and reliable in blocking stray light.

The above and other objects, features, and advantages of the present invention will become apparent from the following description with references to the accompanying drawings which illustrate examples of the present invention.

DETAILED DESCRIPTION OF THE PREFERRED EMBODIMENTS

Figure 1:
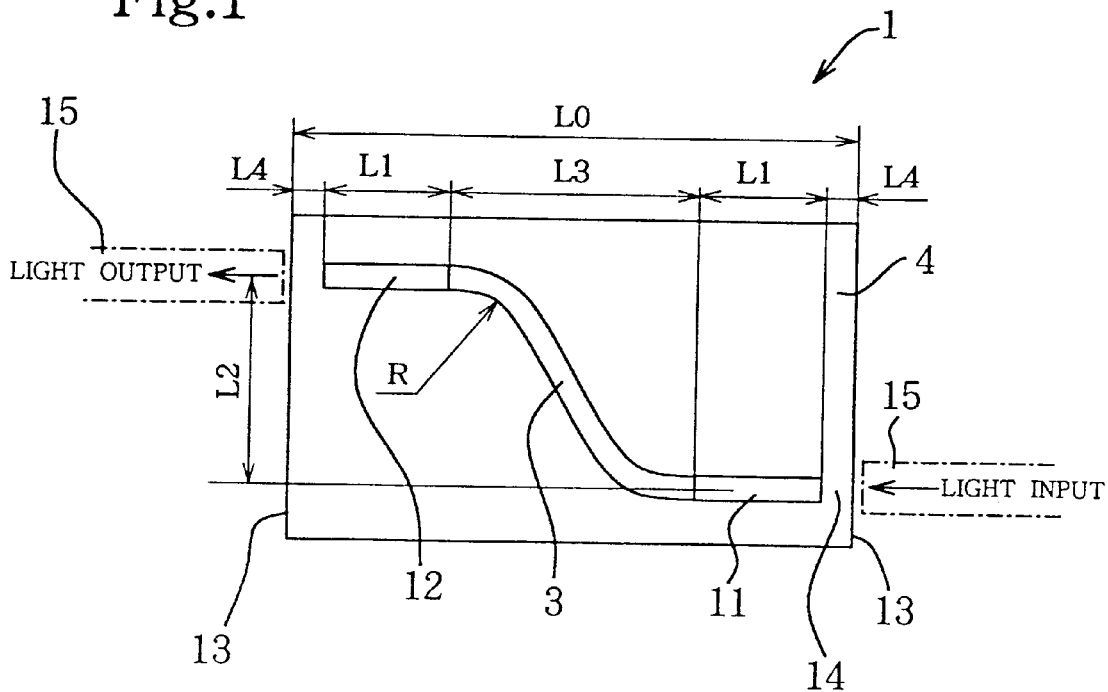
FIG. 1 is a top plan view showing the internal waveguide structure of an SOA according to a first embodiment of the present invention.

Like or corresponding parts are denoted by like or corresponding reference numerals throughout views.

Figure 2:
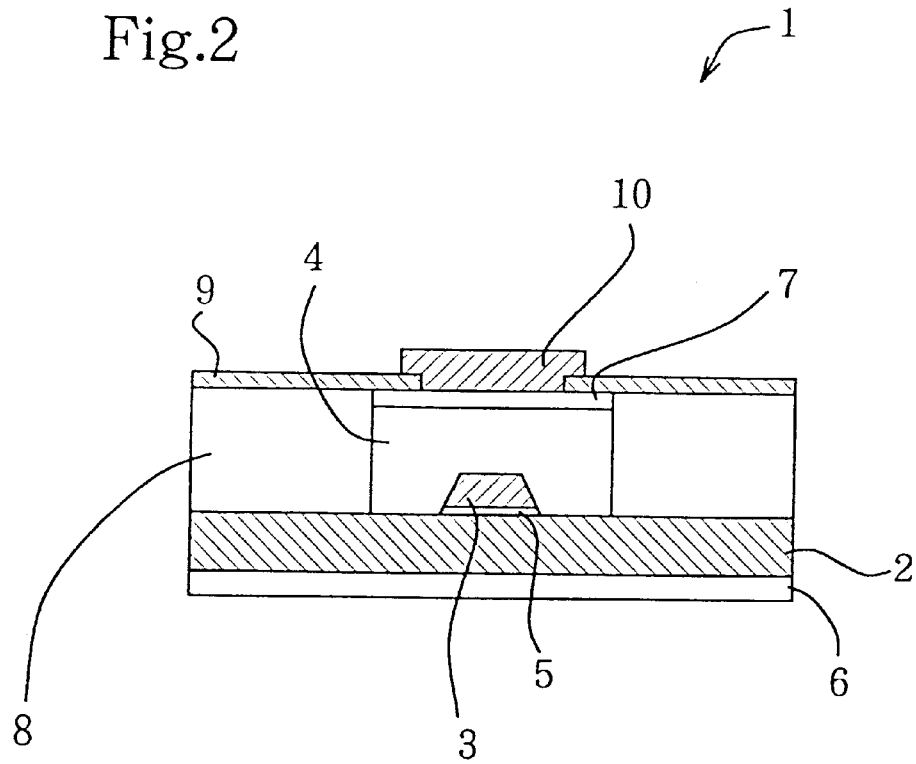
FIG. 2 is a vertical cross-sectional view of the SOA shown in FIG. 1.

FIGS. 1 and 2 show an SOA 1 according to a first embodiment of the present invention.

As shown in FIG. 2, the SOA 1 is fabricated as a BHS(Buried Head Structural)-type LD(Laser Diode) structure on a substrate 2 by an MOVPE(Metal Oxide Vaper Phase Epitaxy) process. The SOA 1 has an active stripe 3 embedded in a cladding layer 4, the active stripe 3 serving as an optical waveguide for guiding light having a wavelength of 1.55 μm.

The substrate 2 is made of n-InP. A n-electrode 6 of Au/Ti is formed on a lower surface of the substrate 2. The active stripe 3, which is of a given shape, is formed on a buffer layer 5 that is formed on the substrate 2 and also embedded in the cladding layer 4.

The active stripe 3 comprises a bulk InGaAsP layer, and has a trapezoidal cross section having a thickness of 3000 Å and a width of 4500 Å. The active stripe 3 is of such a shape that the gain of amplification does not depend on polarization. The cladding layer 4 comprises p-type InP and includes a BH region having a thickness of 5 μm.

A cap layer 7 of $p^+$-InGaAs having a thickness of 1000 Å is formed on an upper surface of the cladding layer 4. Current block layers 8 are formed one on each side of the layers 4, 7. The cladding layer 4, the cap layer 7, and the current block layers 8 are simultaneously grown by MOVPE.

After the cladding layer 4, the cap layer 7, and the current block layers 8 are simultaneously grown, those portions other than the cladding layer 4, which has a width of 10 μm, a reconverted into an insulating layer by proton bombardment. A passivation layer 9 of $SiO_2$ is deposited on an upper surface of the block layers 8. A p-electrode 10 of Au/Ti is formed on the cap layer 7 in a region that is free of the passivation layer 9 above the active stripe 3.

As shown in FIG. 1, the active stripe 3, which serves as the optical waveguide of the SOA 1, is substantially of an S-bent shape. Overall length L0 of the SOA 1 is 800 μm. The S-bent active stripe 3 is 350 μm long, and the curvature of the bent is at a radius R of 1.5 mm. To each ends of the S-bent active stripe 3, straight waveguide 11 and 12 of 200 μm length are attached. The waveguide 11 and 12 extend parallel to each other, and are offset or spaced horizontally to each other by a distance L2 of 50 μm. The thickness of the waveguide 11 and 12 are 3000 Å in region near the end of the active stripe 3 and 500 Å at their tips. The thickness are tapered in order to enlarge a light spot size at the waveguide tips. The light with enlarged spot size at the tip of the waveguide 11 or 12 can be directly coupled to the flat end optical fiber 15 without using a lens system.

The opposite ends of the SOA 1 are covered with anti-reflecting coatings (AR coatings) 13 in the form of SiON films. For effectively reducing the light reflectance of the ends of the SOA 1, the waveguide 11, 12 terminates short of the ends of the SOA 1 with the window regions 14 interposed between the facets of the SOA 1 and the ends of the waveguide 11, 12. The light reflectance of the ends of the SOA 1 is reduced to about 0.1% by the window regions 14 and the anti-reflecting coatings 13.

The flat ends of the optical fibers 15 are optically coupled to the respective opposite ends of the SOA 1 in alignment with the waveguide 11, 12. The SOA 1 is capable of amplifying signal light entered from one of the optical fibers 15 (input optical fiber 15) and outputting the amplified signal light to the other optical fiber 15 (output optical fiber 15), and also capable of extinguishing a signal light entering from one of the optical fibers 15 and hence not outputting the signal light to the other optical fiber 15.

Since the active stripe 3 is curved in an S-shape, the input and output optical fibers 15 that are aligned with the waveguide 11, 12 are kept out of alignment with each other. Consequently, stray light produced from one of the optical fibers 15 does not enter into the other optical fiber 15.

Figure 3:
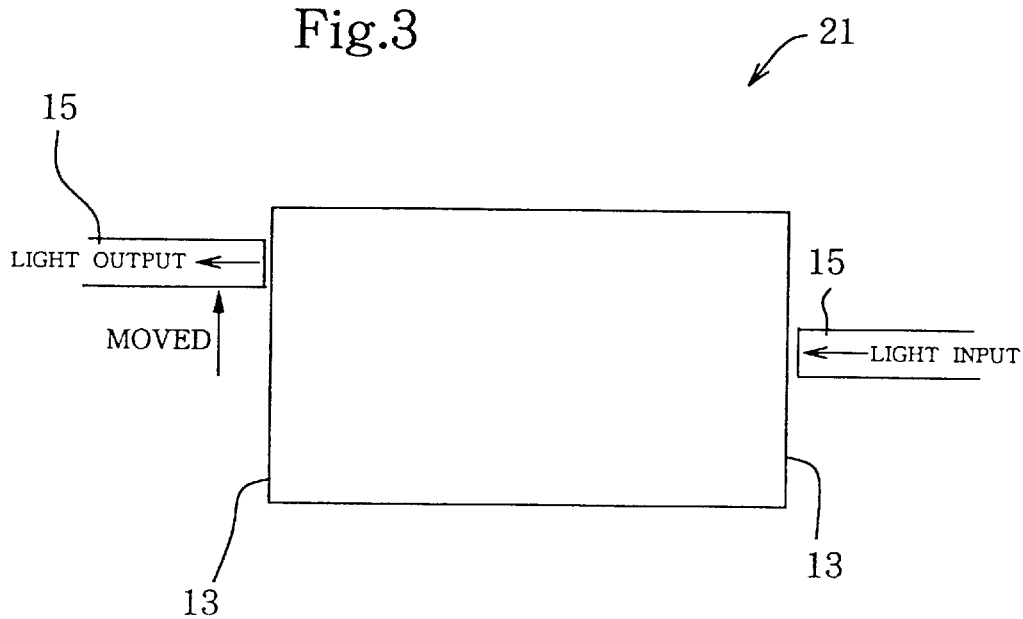
FIG. 3 is a schematic view illustrative of an experiment for measuring stray light.

The results of an experiment conducted by the inventor will be described below. In the experiment, a test piece 21 consisting of the substrate 2 and a layer corresponding to the cladding layer 4 and mounted on the substrate 2 was prepared as shown in FIG. 3. Single-mode optical fibers 15 each having a flat end and a diameter of 9 $\mu$m are positioned so as to face respective opposite ends of the test piece 21.

Figure 4:
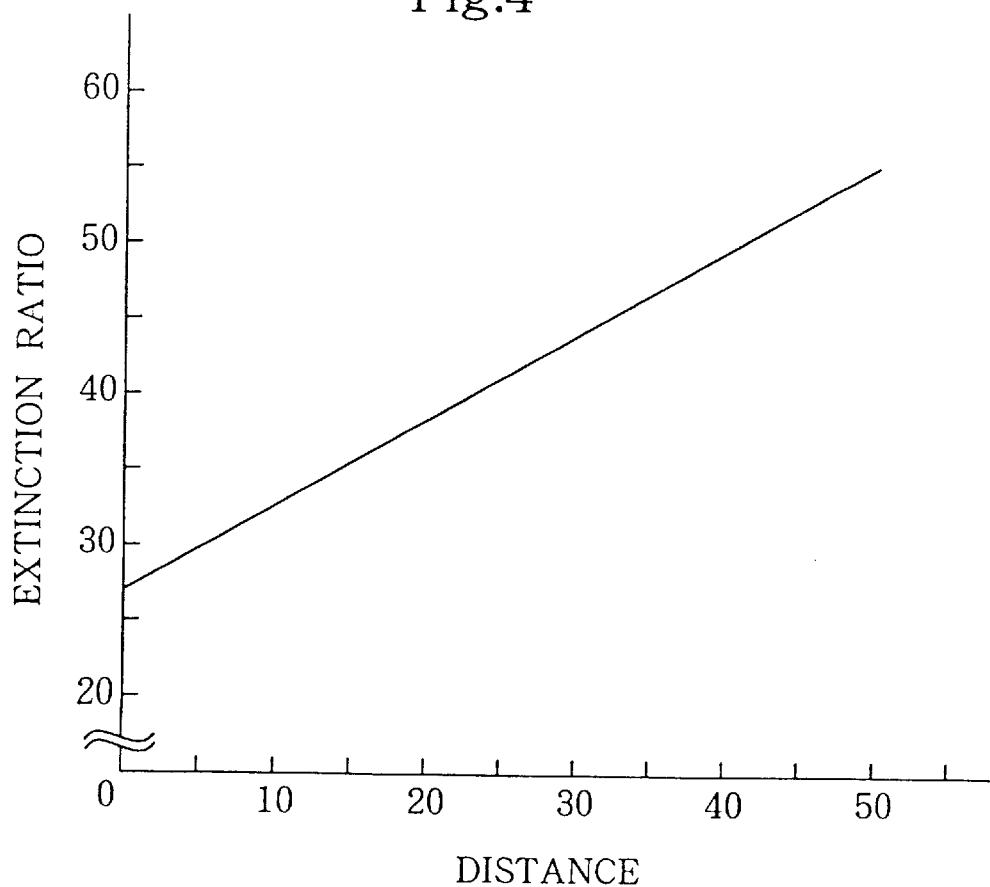
FIG. 4 is a graph showing extinction ratio characteristics of the SOA shown in FIG. 3.

Then, signal light was injected from one of the optical fibers 15 (input optical fiber 15) to the test piece 21, and the intensity of signal light outputted from the test piece 21 to the other optical fiber 15 (output optical fiber 15) was measured as the magnitude of stray light, while at the same time the output optical fiber 15 was being moved relatively to the test piece 21 as indicated. The extinction ratio estimated from the measured intensity of the stray light was plotted with respect to the distance (offset distance) by which the input and output optical fibers 15 are spaced from each other. As shown in FIG. 4, it was confirmed that the extinction ratio and the distance were substantially proportional to each other, and that the extinction ratio was of about 40 dB when the distance was of 20 $\mu$m.

Figure 5:
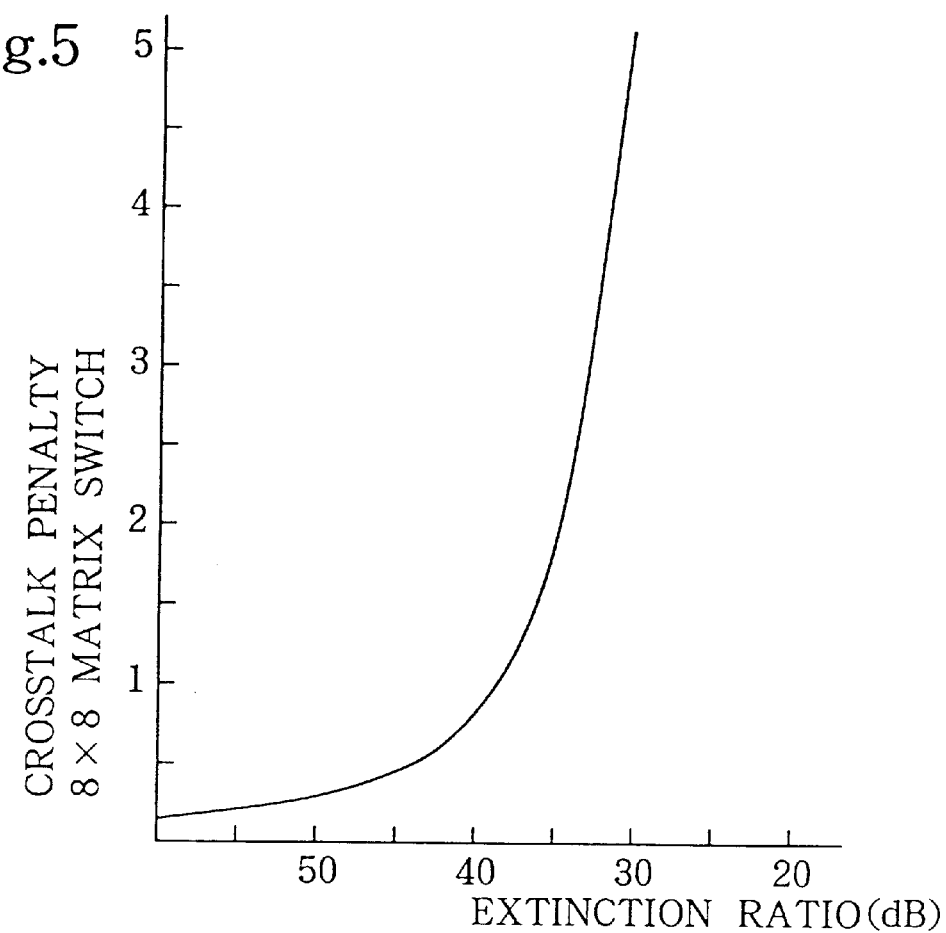
FIG. 5 is a graph showing the relationship between SOA extinction ratio and crosstalk penalty of an 8×8 matrix switch.

For an optical matrix switch using SOAs as optical gate element to achieve crosstalk penalty less than 1 dB, for example, extinction ratio of SOAs should be 40 dB at least as shown in FIG. 5. If this extinction ratio is not satisfied, then crosstalk penalty will greatly increase. Stated otherwise, if the distance by which the input and output optical fibers 15 on the opposite sides of the SOA 1 are spaced from each other is 20 $\mu$m or greater, then the extinction ratio of 40 dB required by an optical gate element can be achieved.

As shown in FIG. 1, optical fibers 15 were positioned relatively to an SOA 1 with an offset distance of 50 $\mu$m. Signal light was injected from one of the optical fibers 15 to the SOA 1, and a photocurrent flowing through the SOA 1 was measured. An optical coupling loss between the optical fiber 15 and the SOA 1 was estimated as of 3 dB on each side of the SOA 1.

Then, a current of 30 mA was injected into the SOA 1, and signal light having a wavelength $\lambda$ of 1.55 $\mu$m and an intensity of 0 dBm was injected through the input optical fiber 15 to the SOA 1. The signal light was outputted from the SOA 1 through the output optical fiber 15 with no insertion loss (the gain between the optical fibers 15 being of 0 dB). When no current was injected, i.e., when the active stripe was turned off, the signal light outputted from the output optical fiber 15 had an intensity of −50 dBm or less.

It has thus been confirmed that the SOA 1 according to the present invention, which is directly optically coupled to the optical fibers, is capable of achieving a high extinction ratio of 50 dB or higher, and can well function as an optical gate element. Since the active stripe 3 is curved in an S-shape, the optical fibers 15 are held parallel to each other, and normal to the facet of the SOA1. Hence the fibers may be positioned with ease.

In the first embodiment, the active stripe 3 is of an S-shape. However, the active stripe 3 may be of a different shape than a S-shape, as described below.

Figure 6:
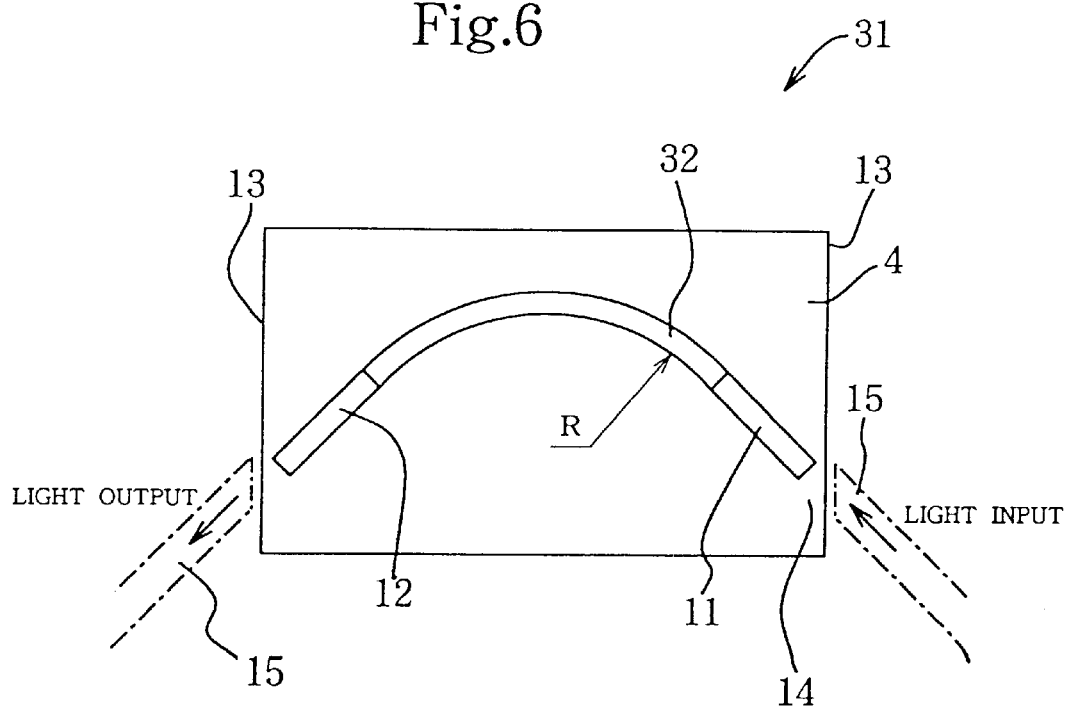
FIG. 6 is a top plan view showing the internal waveguide structure of an SOA according to a second embodiment of the present invention.

FIG. 6 shows an SOA 31 according to a second embodiment of the present invention, which has a substantially arch-shape active stripe 32. For example, the arch-shape active stripe 32 includes a curved portion which may have a radius R of curvature of 2.0 mm.

Optical fibers 15 coupled to the SOA 31 have their optical axes extending in different directions so that an extinction is expected to be longer. The SOA 31 was prepared and measured for an extinction ratio in the same manner as with the test piece according to the first embodiment. It was confirmed that the extinction ratio of the SOA 31 was of 50 dB or higher.

Figure 7:
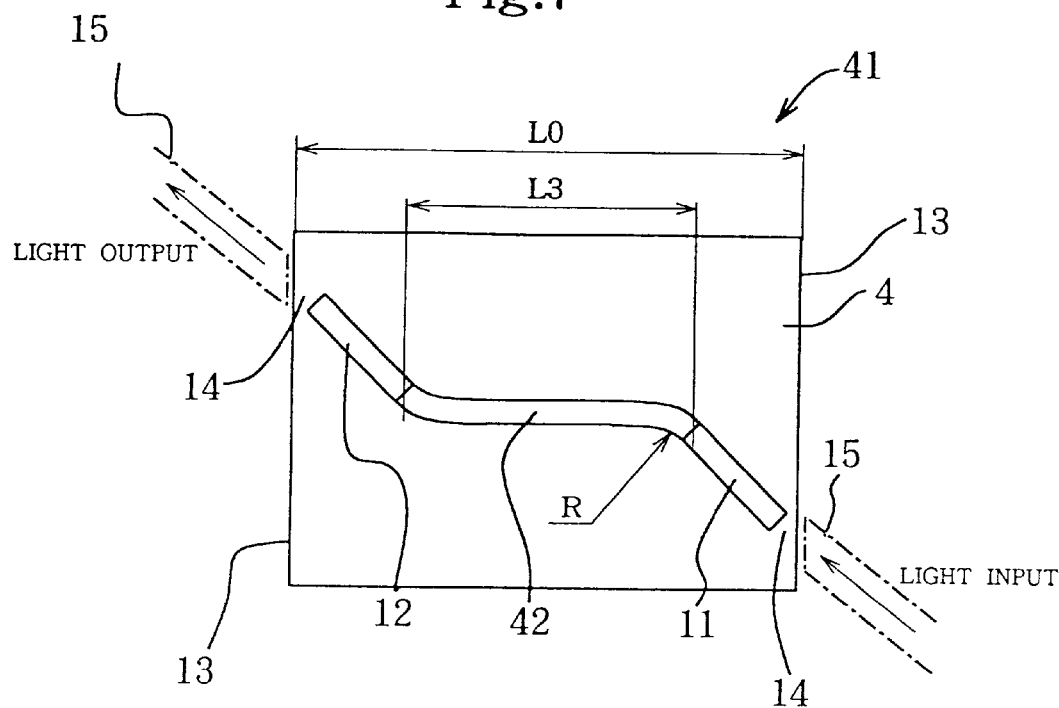
FIG. 7 is a top plan view showing the internal waveguide structure of an SOA according to a third embodiment of the present invention.

FIG. 7 shows the third embodiment SOA 41 of the present invention. The SOA 41 has a substantially S-bent shaped active stripe 42, whose length and curvature are the same as those of the first embodiment SOA 1, i.e., L3=350 $\mu$m and R=1.5 mm. However, the active stripe 42 is formed in a manner that the waveguide 11 and 12 are obliquely directed to the device facets. When currents in the range from 0–30 mA were injected to the SOA 41, it was confirmed that the extinction ratio of the SOA 41 was of 50 dB or higher.

In case of the SOA 31 and 41, the effective light reflectance of the opposite device ends is much reduced, because the waveguide ends are directed obliquely to the device facets, i.e., the facets are angled. Therefore, the SOA 31 and 41 have an advantage of attaining higher fiber-to-fiber-gain than the first embodiment SOA 1 as well as sufficient extinction ratios. When a current of 100 mA was injected, the SOA 31 and 41 obtained 15 dB or higher as fiber-to-fiber-gain. On the other hand, the rate of module production with the SOA 31 or 41 is lower than the SOA 1, because, in case with the SOA 31 or 41, the fiber ends need to be ground obliquely and need to be positioned obliquely. Inasmuch as the SOAs 1,31, 41 have different advantage and disadvantage of their own, SOAs 1,31, 41 should be employed selectively under account of required device performance and the production rate.

With the SOA 1 according to the first embodiment, the optical fibers 15 are offset or spaced from each other to prevent stray light from being transferred from one of the optical fibers 15 to the other optical fiber 15. However the optical fibers 15 offset from each other still suffer the problem of transfer of stray light.

Figure 8:
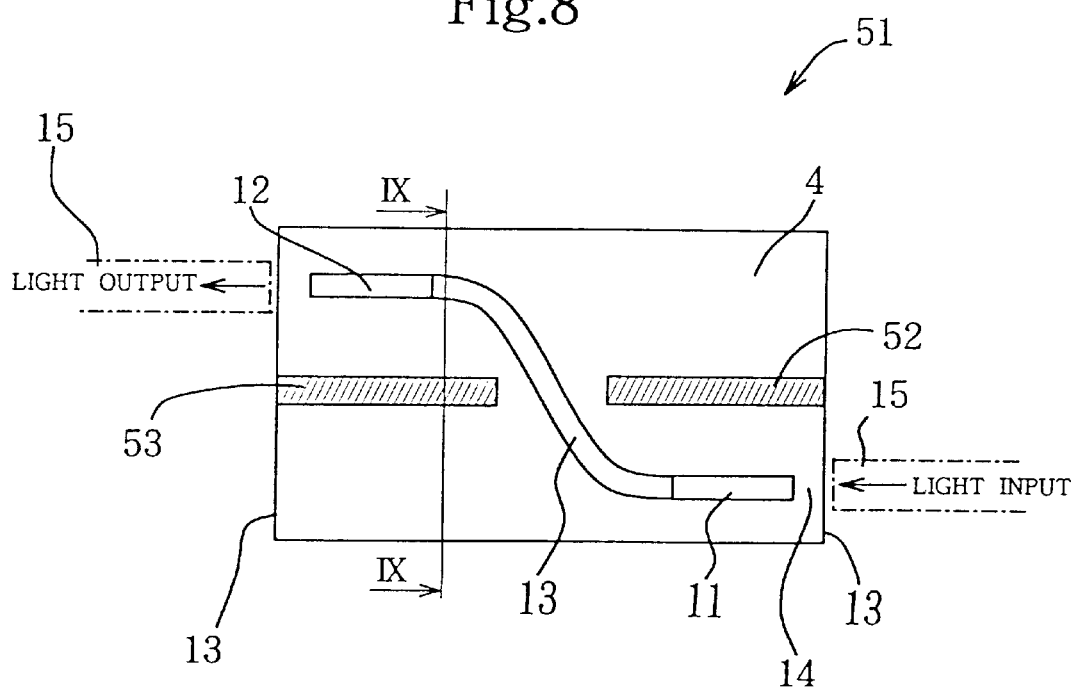
FIG. 8 is a top plan view showing the internal waveguide structure of an SOA according to a fourth embodiment of the present invention.
Figure 9:
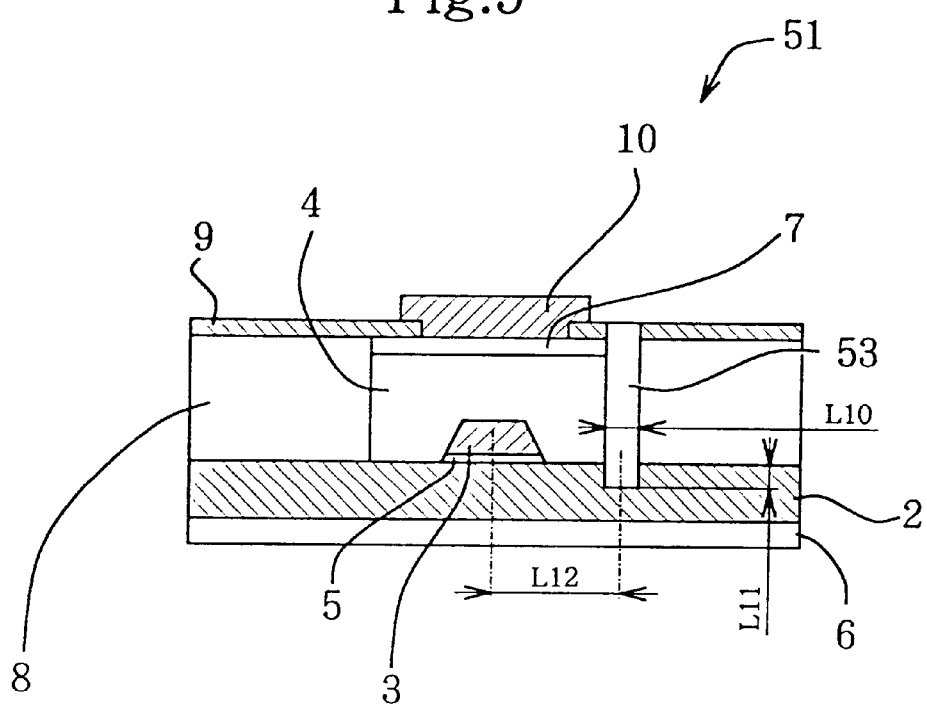
FIG. 9 is a cross-sectional view taken along line IX—IX of FIG. 8.

FIGS. 8 and 9 show an SOA 51 according to a fourth embodiment which is designed to be more effective to prevent stray light from being transferred with light shields.

As shown in FIGS. 8 and 9, the SOA 51 has a first light shield 52 formed in a space between the waveguide 11 and an extended axis of the waveguide 12 thereof, and a second light shield 53 disposed in a space between an extension of the central axis of the waveguide 11 and the waveguide 12 thereof. The first and second light shields 52, 53 extend parallel to the waveguide 11, 12 and terminate short of the active stripe 3.

Each of the first and second light shields 52, 53 comprises a groove extending downwardly from the surface of the passivation layer 9 into the substrate 2. Each of the first and second light shields 52, 53 includes a portion extending downwardly from the surface level of the substrate 2 into the substrate 2 and having a depth L11 of 4 μm or greater. In the illustrated embodiment, each of the first and second light shields 52, 53 has a width L10 of 10 μm, the depth L11 is of 5 μm, and the center of each of the first and second light shields 52, 53 is transversely spaced from the center of the active stripe 3 by a distance L12 of 25 μm.

Stray light around the input waveguide 11, injected from the optical fiber 15, diverges and propagates in a medium of the cladding layer 4 and substrate 2. However, the divergence and propagation is blocked by the first and second light shield 52, 53 and hence does not reach to the opposite the waveguide 12. Therefore, stray light does not enter into the output optical fiber 15 that is aligned to the waveguide 12. The extinction ratio of the SOA 51 is thus better than those of the SOAs 1, 31, 41.

The first and second light shields 52, 53 can easily be formed because they are in the form of grooves. Since their portions extending downwardly from the surface of the substrate 2 into the substrate 2 have the depth L11 of 4 μm or greater, if the optical fibers 15 have a diameter of about 9 μm as is the case with general optical fibers, then the bottoms of the first and second light shields 52, 53 are positioned outside of the end surfaces of the optical fibers 15, so that the first and second light shields 52, 53 are highly effective and reliable in blocking stray light. A test piece of the SOA 51 was prepared and measured for an extinction ratio in the same manner as with the test piece according to the first embodiment. It was confirmed that the extinction ratio of the test piece was better than the test piece according to the first embodiment.

While preferred embodiments of the present invention have been described using specific terms, such description is for illustrative purposes only, and it is to be understood that changes and variations may be made without departing from the spirit or scope of the following claims.

What is claimed is:

1. A semiconductor optical amplifier comprising;
   a substrate; and
   an active stripe formed and having at least a curved portion on said substrate, wherein a cross point of an input end axis and a line parallel to an output end facet deviates at least 20 μm from an output point on said output end facet;
   said active stripe having a bent shape with an input waveguide end and an output waveguide end being offset from each other; and
   further comprising a light shield formed between an extended axis of said input waveguide end and said output waveguide end.

2. A semiconductor optical amplifier according to claim 1, wherein said active stripe has input and output waveguide ends offset from each other by a distance of at least 20 μm.

3. A semiconductor optical amplifier according to claim 1, wherein said curved portion of said active strips has an S-bent shape, said S-bent shape active stripe being formed such that said input and output waveguide ends are directed obliquely to device facets.

4. A semiconductor optical amplifier comprising;
   a substrate;
   an active stripe formed and having at least a curved portion on said substrate, wherein a cross point of an input end axis and a line parallel to an output end facet deviates at least 20 μm from an output point on said output end facet;
   said active stripe having a bent shape with an input waveguide end and an output waveguide end being offset from each other; and
   further comprising a light shield formed between an extended axis of said output waveguide end and said input waveguide end.

5. A semiconductor optical amplifier according to claim 3, wherein said light shield comprises a groove.

6. A semiconductor optical amplifier according to claim 4, wherein said light shield comprises a groove.

7. A semiconductor optical amplifier according to claim 5, wherein said light shield includes a portion extending to a depth of at least 4 μm from a substrate surface level.

8. A semiconductor optical amplifier according to claim 4, wherein said light shield includes a portion extending to a depth of at least 4 μm from a substrate surface level.

9. A semiconductor optical amplifier according to claim 5, wherein said groove includes a portion extending to a depth of at least 4 μm from a substrate surface level.

10. A semiconductor optical amplifier according to claim 6, wherein said groove includes a portion extending to a depth of at least 4 μm from a substrate surface level.

* * * * *